United States Patent [19]

El Hamamsy

[11] 4,275,308
[45] Jun. 23, 1981

[54] OPTICALLY TOGGLED DEVICE

[75] Inventor: Mahmoud A. El Hamamsy, Watchung, N.J.

[73] Assignee: Bell Telephone Laboratories, Incorporated, Murray Hill, N.J.

[21] Appl. No.: 154,857

[22] Filed: May 30, 1980

[51] Int. Cl.$^3$ ............................................. G02B 27/00
[52] U.S. Cl. ..................................... 250/551; 307/311
[58] Field of Search ......................... 250/551; 307/311

[56] References Cited
PUBLICATIONS

"1980 IEEE International Solid State Circuits Conference", THPM 14.1, Feb. 14, 1980, pp. 170–171.

Primary Examiner—David C. Nelms
Assistant Examiner—Darwin R. Hostetter
Attorney, Agent, or Firm—Richard D. Laumann

[57]  ABSTRACT

A device is described using a gated diode switch with its current conduction state controlled by a photovoltaically controlled field effect transistor connected in series with the gated diode switch.

8 Claims, 5 Drawing Figures

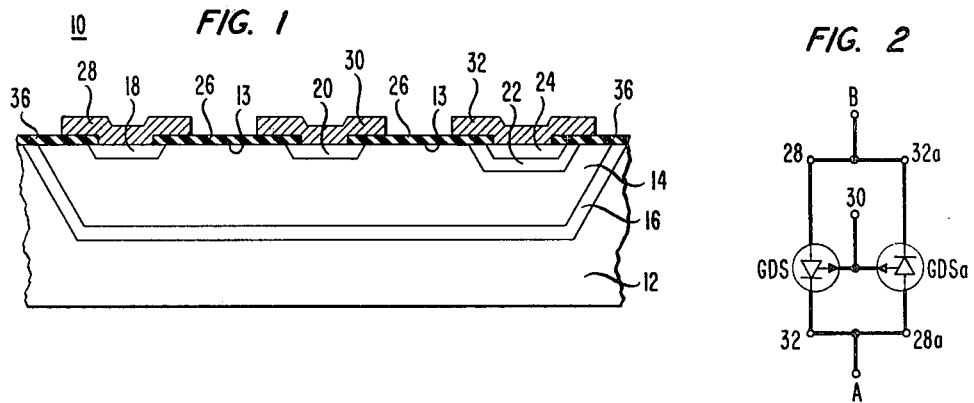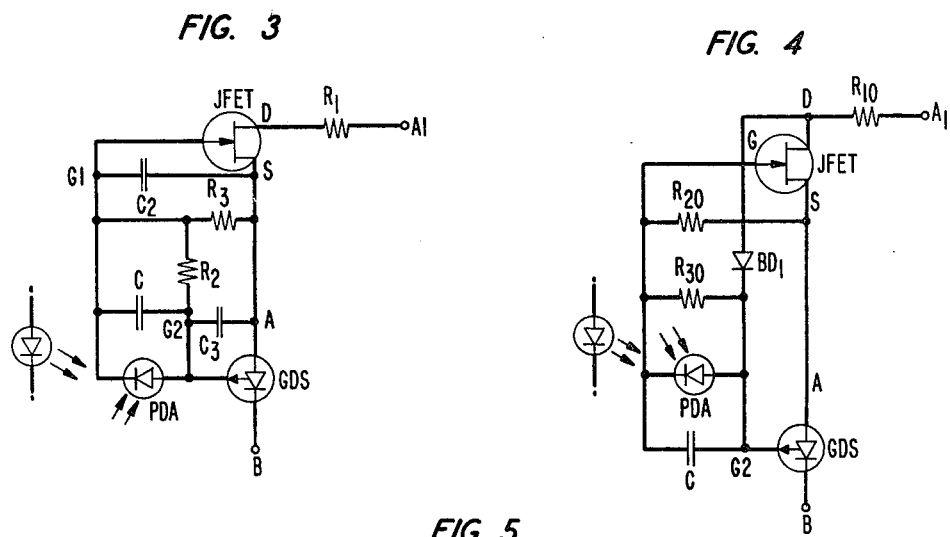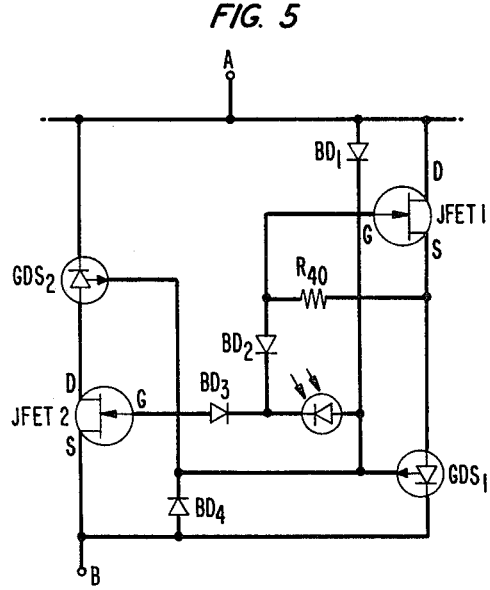

OPTICALLY TOGGLED DEVICE

TECHNICAL FIELD

This invention is concerned generally with optically toggled switches and particularly with optically toggled switches capable of blocking high voltages and carrying large currents.

BACKGROUND OF THE INVENTION

Much interest and effort in recent years has been directed toward the development of solid state switches. Such switches would find numerous applications in modern technology where their advantages, as compared to other types of switches, of small size, high reliability, etc., can be fully exploited. For example, such switches could be advantageously used as crosspoint switches in telecommunications systems.

Effort has been directed specifically toward the development of solid state switches capable of blocking high voltages and carrying large currents. For maximum versatility, such switches should be easily manufactured with other or similar switching devices on a common substrate. This should permit economies of manufacture and design flexibility.

A switch with such characteristics has been developed and is commonly referred to as a gated diode switch or GDS. This switch has a low impedance path in the ON or conducting state and a high impedance path in the OFF or blocking state. The switch can be easily fabricated in embodiments that will block voltages as large as 500 volts and carry currents larger than one ampere. Bilateral embodiments may be fabricated on a single chip with antiparallel connected switches.

Any of several methods may be used to control the current conduction state of the GDS. That is, several methods are available to change the switch from the ON state to the OFF state or vice versa. For example, either an opto-isolator or a metal oxide semiconductor (MOS) transistor in series with the GDS may be used to control the current conduction state. Light sensitive devices, e.g., a photodiode array, may also be used to control the current conduction state. Although perfectly adequate for many purposes, these methods have drawbacks for some applications.

When an opto-isolator is used, the maximum current capability of the switch is limited by the current handling capability of the opto-isolator. This is usually rather small and typically is only 0.5 amperes. When a metal oxide semiconductor transistor is used, a normally OFF device is connected in series with the normally ON GDS and the switch is therefore normally OFF. Photodiode arrays, because they produce only a small current when illuminated, are useful for switching a GDS only if the current through the GDS is very small, comparable to the photodiode array current, or for switching alternating currents. For some applications, these are undesirable features.

SUMMARY OF THE INVENTION

It has been found that an optically toggled switch may be constructed having a field effect transistor (FET) connected in series with a gated diode switch (GDS). A series connected photodiode array (PDA) controls the current conduction state of both the GDS and the FET. The series connected photodiode array is connected between the gate electrodes of the GDS and the FET. The photodiode array is optically coupled to a light source which is typically a light emitting diode.

Upon illumination by the LED, the PDA develops a voltage at least equal to the pinch off voltage of the FET and changes the current conduction state of the normally ON FET to OFF, i.e., the drain-source channel changes from conducting to non-conducting. The current flowing in the series circuit, and thus in the gated diode switch, then drops below the holding current of the GDS and the GDS will also turn OFF. After the LED is turned OFF, the FET returns to its ON state in a time interval determined by a first RC timing circuit. The GDS remains in the OFF state for a time period determined by a second RC timing circuit.

In a particular embodiment, voltages higher than the breakdown voltage of the FET are handled by the addition of a blocking diode between the drain of the FET and the gate electrode of the GDS.

Switches of this invention may be constructed in both unilateral or bilateral embodiments.

BRIEF DESCRIPTION OF THE DRAWING

FIG. 1 illustrates a structure of one embodiment of a gated diode switch;

FIG. 2 is a schematic representation of a bilateral gated diode switch;

FIG. 3 illustrates another embodiment of an optically toggled gated diode switch;

FIG. 4 illustrates still another embodiment of an optically toggled gated diode switch; and FIG. 5 illustrates a bilateral embodiment of an optically toggled gated diode switch.

DETAILED DESCRIPTION

It is believed that this invention will be better understood if first the structure and then the operation of a gated diode switch are briefly described.

One embodiment of a gated diode switch (GDS) is illustrated generally as 10 in FIG. 1. GDS 10 comprises support 12 which has a major surface 13 and a semiconductor body 14 whose bulk is of a first conductivity type and which is separated from support 12 by a dielectric layer 16. A first anode region 18 is included in body 14 and has a portion which extends to surface 13. A gate region 20 is included in body 14 and has a portion which extends to surface 13. A cathode region 24 is included in body 14 and has a portion which extends to surface 13. Region 22 encircles region 24 and has a portion which extends to surface 13. Region 22 acts as a depletion layer punch-through shield and inhibits inversion of the portions of body 14 at or near surface 13 between regions 20 and 24. Regions 18 and 22 are of said first conductivity type. Regions 20 and 24 are of a second conductivity type. The resistivities of region 18, 20 and 24 are small with respect to the resistivity of the bulk portion of body 14. Region 22 has a resistivity intermediate that of region 24 and body 14. Electrodes 28, 30 and 32 make low resistance ohmic contacts to the surface portions of regions 18, 20, and 24, respectively. A dielectric layer 36 covers surface 13 and isolates electrodes 28, 30, and 32 from all regions other than those intended to be electrically contacted.

Region 18 is typically 2 to 4 microns thick and 48 microns wide by 52 microns long. Region 20 is typically 2 to 4 microns thick and 15 microns wide by 300 microns long. Region 22 is typically 3 to 6 microns thick and 64 microns wide by 60 microns long. Region 24 is typically 2 microns thick and 48 microns wide by 44 microns long.

In one preferred embodiment, support 12 and body 14 are each of silicon and support 12 may be of either n or p type conductivity. Body 14 is typically 30 to 50 microns thick and 430 microns long by 300 microns wide. Substrate 12, body 14 and regions 18, 20, 22, and 24 are of n−, p−, p+, n+, p, and n+ type conductivity, respectively. Impurity concentrations are typically $2 \times 10^{13}$, $5 \times 10^{13}$, $10^{17}$, $10^{19}$, $10^{17}$ to $10^{18}$, and $10^{19}/cm^3$ for substrate 12, body 14 and regions 18, 20, 22, and 24, respectively. Layer 16 is silicon dioxide and is typically 2 to 4 microns thick. Electrodes 28, 30 and 32 are aluminum.

A plurality of separate bodies 14 can be formed in a common support 12 to provide a plurality of switches. Other modifications of the embodiment depicted will be readily thought of by those skilled in the art.

The operation of the gated diode switch will now be described. Structure 10 is typically operated as a switch which is characterized by a low impedance path between regions 18 and 24 when the switch is in the ON or conducting state and a high impedance path between regions 18 and 24 when in the OFF or blocking state. When the switch is in the ON state, holes are injected into body 14 from region 18 and electrons are injected into body 14 from region 24. The holes and electrons can be in sufficient numbers to form a plasma whose conductivity modulates body 14. This effectively lowers the resistance of body 14 so that the resistance between regions 18 and 24 is relatively low when structure 10 is in the ON state. This type of operation is conveniently designated as dual carrier injection. Substrate 12 is typically held at the most positive potential conveniently available.

The potential applied to gate region 20 determines the current conduction state of the switch. Conduction between regions 18 and 24 occurs when the potential of region 20 is below the potentials of region 18 and region 24. Conduction between regions 18 and 24 is either inhibited or terminated when the potential of region 20 is more positive than the potentials of regions 18 and 24. The excess positive potential needed to either inhibit or terminate conduction is, as is well known, a function of both geometry and impurity concentrations of structure 10. The positive gate potential causes the portion of body 14 between region 20 and the portion of layer 16 below region 20 to be depleted. Consequently, the potential of this portion is more positive than the potentials of regions 18 and 24 and inhibits the conduction of holes from region 18 to region 24 by essentially pinching off body 14 against layer 16 in the portion below region 20. It also collects electrons emitted at region 24 before they reach region 16. A direct current through the switch will not be broken unless the potential source also supplies a current comparable to that initially flowing through the GDS.

FIG. 2 illustrates both an electrical symbol for a gated diode switch and a bilateral switch using two gated diode switches. The anode, gate and cathode electrodes of GDS are terminals 28, 30, and 32, respectively. The anode, gate and cathode electrodes of GDSa are terminals 28a, 30, and 32a, respectively. The operation of the switch is invariant with respect to the polarity of the voltage applied between terminals A and B.

Upon illumination by an LED or other light source, a series connected photodiode array (PDA) connected to terminals A and B and having a sufficient number of photodiodes to develop a positive voltage of approximately 20 volts between the gate and anode of the GDS will change the bilateral switch formed by the two antiparallel connected GDSs from the ON to the OFF state if the current flowing between terminals A and B is less than the PDA current which may be defined here as the holding current. The holding current is typically approximately 20 to 30 microamps. The switch can, of course, be made in the unilateral embodiment if only one GDS is used. Since the current conduction state of the switch can change only when the current level falls below the value of the holding current, the switch cannot be used for DC voltages between terminals A and B. It can only be used when an AC current flows between terminals A and B.

A first embodiment of a device of this invention that will switch both alternating and direct currents is schematically represented in FIG. 3. A series circuit is formed between first and second terminals $A_1$ and B by resistance $R_1$, the channel between the drain and source electrodes of an N-channel depletion mode JFET, and the channel between anode and cathode electrodes of a gated diode switch. The anode of the GDS is connected to the JFET source electrode and the cathode is connected to terminal B. A series connected photodiode array, represented by PDA, capacitance, C, and resistance, $R_2$, form a parallel circuit with one terminal connected to the gate electrode, $G_2$, of the GDS and the other terminal connected to the gate electrode, $G_1$, of the JFET. A series circuit comprising the connection of the second terminal to the gate electrode is thus formed. If desired, $R_1$, C, and $R_2$ may be omitted. If $R_1$ is omitted, $A_1$ is connected to the drain electrode. The number of photodiodes in the photodiode array is sufficient to produce a voltage upon illumination that exceeds the JFET pinch-off voltage. Resistance $R_3$ is connected between the source and gate electrodes of the JFET. Typical values of C, $R_2$ and $R_3$ are approximately $0.2\mu$F, 22 M$\Omega$, and 1 M$\Omega$, respectively. A light source, typically a light emitting diode which is represented by LED, is optically coupled to the PDA.

Both the JFET and GDS are optically toggled to the OFF state by means of the photodiode array. When the PDA is illuminated by the LED, the JFET is toggled to its OFF state and as a result the current through the GDS drops below the PDA current and the current conduction state of both the GDS and the entire device then changes to the OFF state. Both capacitances $C_2$ and $C_3$ between electrodes $G_1$ and S, and A and $G_2$, respectively, are charged and when the LED current is reduced to zero and the PDA illumination ceases, the JFET will revert to the ON state in a time interval determined by the time constant of $C_2$ and $R_3$. The capacitances may be the internal device capacitances. The GDS remains in the OFF state for a longer time interval which is determined by the time constants of $R_2C$ and $C_3 (R_3+R_2)$.

The voltage between terminals $A_1$ and B is applied totally between A and B after the JFET reverts to its ON state. However, if the voltage between $A_1$ and B is greater than the breakdown voltage of the JFET, the device operation is somewhat different because the drain-gate junction of the JFET will break down before the current flowing through the gated diode switch is interrupted and the GDS will thus never switch to its OFF state.

Another embodiment of an optically toggled device of this invention which can handle large voltages is shown in FIG. 4. This embodiment is similar to that depicted in FIG. 3 and the detailed description of FIG. 3 need not be repeated. Resistances $R_2$ and $R_3$ in FIG. 3 are equivalent to resistances $R_{30}$ and $R_{20}$, respectively, in FIG. 2. A blocking diode, represented schematically by $BD_1$, is connected between the drain electrode of the JFET and the gate electrode of the gated diode switch. In this embodiment, when the voltage between terminals $A_1$ and B is initially larger than the breakdown voltage of the JFET, diode $BD_1$ transfers the voltage at electrode D directly to electrode $G_2$ and thus drives the potential of electrode $G_2$ to a very large value with respect to point A. The potential difference between electrodes $G_2$ and A is equal to the breakdown voltage of the JFET. This has the effect of momentarily raising the value of the required holding current of the gated diode switch to a very large value and thus, upon illumination of PDA, the gated diode switch changes its current conduction state to the OFF state. The switching to the ON state is the same as for the circuit described in FIG. 3.

A bilateral embodiment of a device of this invention is shown in FIG. 5. The drain-source channel of JFET1 and $GDS_1$ form a first series circuit between terminals A and B and $GDS_2$ and the drain-source channel of JFET2 form a second series circuit between terminals A and B. The two series circuits are the same as the series circuits described with respect to FIGS. 3 and 4 but are connected with opposite polarities. A series connected photodiode array, represented by PDA has one terminal connected to electrodes G of $GDS_1$ and $GDS_2$ and a second terminal connected to one electrode of blocking diodes BD2 and BD3. The second electrodes of blocking diodes BD2 and BD3 are connected to the gate electrodes of JFET1 and JFET2, respectively. Blocking diodes BD1 and BD4 have one electrode connected to terminals A and B, respectively, and a second electrode connected to the gate electrodes of $GDS_1$ and $GDS_2$. The operation of this embodiment upon illumination of the PDA is similar to the operation of the embodiment described in FIGS. 3 and 4.

The embodiments described illustrate the invention and modifications will be readily thought of. For example, support 12 might be p-type silicon, gallium arsenide, etc. Further, impurity concentrations, spacings between regions, etc., can be modified to permit different operating voltages and currents. Additionally, the operation of many JFETS is symmetric with respect to source and drain and for such JFETS, these terms are used interchangeably.

I claim:

1. A device comprising:
    a gated diode switch having anode, cathode, and gate electrodes; first and second terminals; said cathode being connected to said second terminal; and means for changing the current conduction state of said device
    CHARACTERIZED IN THAT
    said means comprises a first field effect transistor having drain, gate and source electrodes, said source electrode being connected to said anode electrode, said drain electrode being connected to said first terminal and a photodiode array, said array having a first terminal connected to said gate electrode of said gated diode switch and a first series circuit comprising a second terminal connected to said gate electrode of said field effect transistor.

2. A device as recited in claim 1 further comprising a light source, said light source being optically coupled to said photodiode array.

3. A device as recited in claim 1 or 2 in which said means further comprises a first capacitance and a first resistance, said capacitance and said resistance being connected to said gate electrodes of said gated diode switch and said field effect transistor.

4. A device as recited in claim 3 further comprising a second resistance, said second resistance connected to said source electrode and said gate electrode of said field effect transistor.

5. A device as recited in claim 4 in which said means further comprises a second capacitance connected to said source and gate electrodes of said field effect transistor.

6. A device as recited in claim 4 in which said means further comprises a third capacitance connected to said anode and gate electrodes of said gated diode switch.

7. A device as recited in claim 4 further comprising a blocking diode connected to said drain electrode and said gate electrode of said gated diode switch.

8. A device as recited in claim 1 further comprising a second gate diode switch having anode, cathode and gate electrodes, said cathode being connected to said first terminal; and in which said means further comprises a second field effect transistor having drain, gate and source electrodes, said drain electrode being connected to said anode electrode, said source electrode being connected to said second terminal, said photodiode array having said first terminal connected to said gate electrode of said second gated diode switch, a second series circuit between said gate electrode of said second field effect transistor and said second terminal of said array comprising a first blocking diode, said first series circuit further comprising a second blocking diode connected to said second terminal of said array and said gate of said first field effect transistor, a third blocking diode having one electrode connected to said first terminal and a second electrode connected to said gate electrode of said first gated diode switch, and a fourth blocking diode having one electrode connected to said second terminal and a second electrode connected to said gate electrode of said second gated diode switch.

* * * * *